(12) United States Patent
Cho et al.

(10) Patent No.: US 7,074,661 B2
(45) Date of Patent: Jul. 11, 2006

(54) METHOD FOR FABRICATING SEMICONDUCTOR DEVICE WITH USE OF PARTIAL GATE RECESSING PROCESS

(75) Inventors: Heung-Jae Cho, Ichon-shi (KR); Se-Aug Jang, Ichon-shi (KR); Kwan-Yong Lim, Ichon-shi (KR)

(73) Assignee: Hynix Semiconductor Inc., Lehon Shi (KR)

( * ) Notice: Subject to any disclaimer, the term of this patent is extended or adjusted under 35 U.S.C. 154(b) by 43 days.

(21) Appl. No.: 10/879,732

(22) Filed: Jun. 30, 2004

(65) Prior Publication Data

US 2005/0095797 A1    May 5, 2005

(30) Foreign Application Priority Data

Oct. 29, 2003    (KR)    ............... 10-2003-0076032

(51) Int. Cl.
*H01L 21/8234*    (2006.01)
(52) U.S. Cl. ..................... 438/197; 438/595
(58) Field of Classification Search ........... 438/595, 438/653, 656, 657
See application file for complete search history.

(56) References Cited

U.S. PATENT DOCUMENTS

| 6,307,226 B1 * | 10/2001 | Dennison | 257/296 |
| 6,720,630 B1 * | 4/2004 | Mandelman et al. | 257/406 |
| 6,753,215 B1 * | 6/2004 | Kasuya | 438/197 |

* cited by examiner

*Primary Examiner*—B. William Baumeister
*Assistant Examiner*—Matthew L Reames
(74) *Attorney, Agent, or Firm*—Finnegan, Henderson, Farabow, Garrett, & Dunner, L.L.P.

(57) ABSTRACT

Disclosed is a method for fabricating a semiconductor device with a polymetal gate electrode formed by a partial gate recessing process. The method includes the steps of forming a gate structure including a gate dielectric layer, a polysilicon layer, a metal layer, an etch stop layer and a sacrificial layer sequentially formed on a substrate; selectively performing a re-oxidation process to the gate structure; forming a spacer on each sidewall of the gate structure; implanting ions in the substrate for forming source/drain regions; selectively removing the sacrificial layer of the gate structure to form a recess; and filling an insulating hard mask into the recess for use in a self-aligned contact etching process.

8 Claims, 7 Drawing Sheets

METHOD FOR FABRICATING SEMICONDUCTOR DEVICE WITH USE OF PARTIAL GATE RECESSING PROCESS

The present application relates to and claims priority from Korean patent application No. KR 2003-0076032, filed in the Korean Patent Office on Oct. 29, 2003, the entire contents of which are incorporated herein by reference.

1. Field of the Invention

The present invention relates to a method for fabricating a semiconductor device; and, more particularly, to a method for forming a transistor with a polymetal gate electrode.

2. Description of Related Arts

Recently, as the design rule of a metal oxide semiconductor field effect transistor (MOSFET) has been rapidly scaled down to the size of about 90 nm, a linewidth of a gate electrode, a thickness of a gate dielectric layer, and a depth of a source/drain junction have been also decreased in order to meet the recent demand. Particularly, it is highly mandated to develop a gate electrode with a low resistance to solve a problem of a resistance-capacitance (RC) delay.

Therefore, a study on a stack gate electrode of transition metal-silicide and polysilicon which can substitute a gate electrode of polysilicon has been actively progressed. Hereinafter, the stack gate electrode of transition metal-silicide and polysilicon is referred to as the polycide gate electrode. Recently, a tungsten polycide gate electrode, i.e., a stack gate electrode of tungsten silicide and polysilicon is being mass produced. However, the tungsten polycide gate electrode has a very high value of resistivity, and thus, it is limited in reducing a sheet resistance of a gate electrode.

To solve this problem, it is contrived to use a material such as tungsten which has about several times, e.g., eight times, less resistivity than tungsten silicide. One example of the suggested polycide gate electrode is a tungsten polymetal gate electrode, i.e., a stack gate electrode of tungsten and polysilicon.

Figure 1:
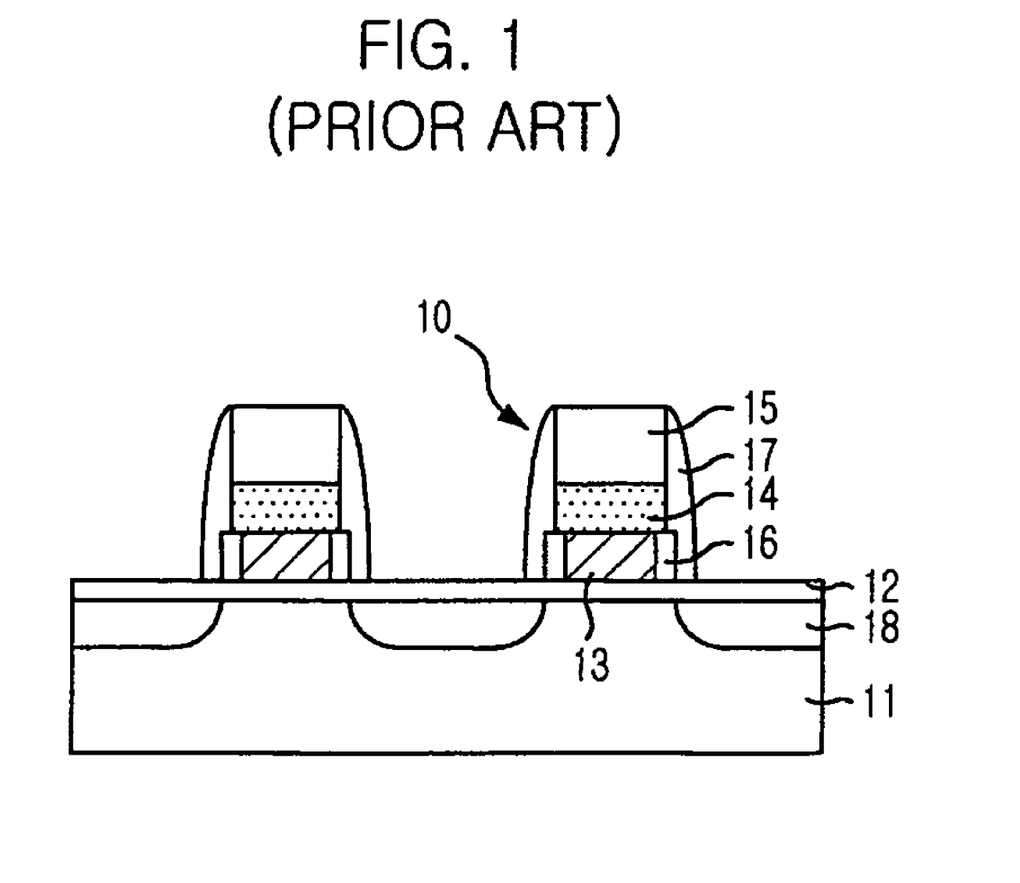
FIG. 1 is a cross-sectional view of a conventional semiconductor device with a tungsten polymetal gate electrode.

FIG. 1 is a cross-sectional view of a conventional transistor with a tungsten polymetal gate electrode.

As shown, a plurality of gate structures 10 are formed on a substrate 11. Each gate structure 10 includes a gate dielectric layer 12, a polysilicon layer 13, a tungsten layer 14 and a hard mask 15. Then, a gate re-oxidation process is applied thereto. At this time, a selective oxidation process which does not oxidize the tungsten layer 14 but oxidizes the polysilicon layer 13 is performed to thereby form a silicon oxide layer 16 on both sidewalls of the polysilicon layer 13.

Afterwards, a spacer 17 is formed on each sidewall of the gate structure 10. An ion implantation process is then performed to form a plurality of source/drain regions 18. After the ion-implantation process, an annealing process is typically performed to electrically activate dopants, and a required temperature for the annealing process ranges from 950° C. to 1000° C.

However, this relatively high temperature may induce a mechanical stress originated from the hard mask 15, and this induced mechanical stress subsequently causes reliability of the gate dielectric layer 12 to be deteriorated.

Figure 2A:
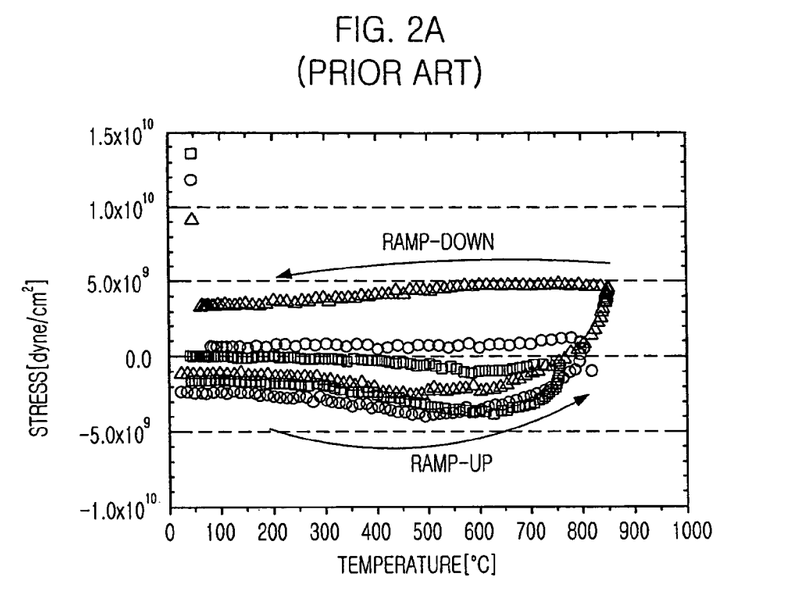
FIG. 2A is a graph showing changes in a thermal stress induced to a conventional gate dielectric layer depending on a temperature for an annealing process.

FIG. 2A is a graph showing changes in thermal stress induced in a conventional gate dielectric layer depending on a temperature at which the annealing process is performed. Herein, the curves plotted by □, ○, Δ are thermal hysteresis curves obtained when the temperature for the annealing process ramps up to a certain temperature and then ramps down. Specifically, the curves plotted by □, ○, Δ are obtained when the temperature sweeps up to 750° C., 800° C. and 850° C., respectively.

As shown, as the temperature increases, the thermal stress increases.

Figure 2B:
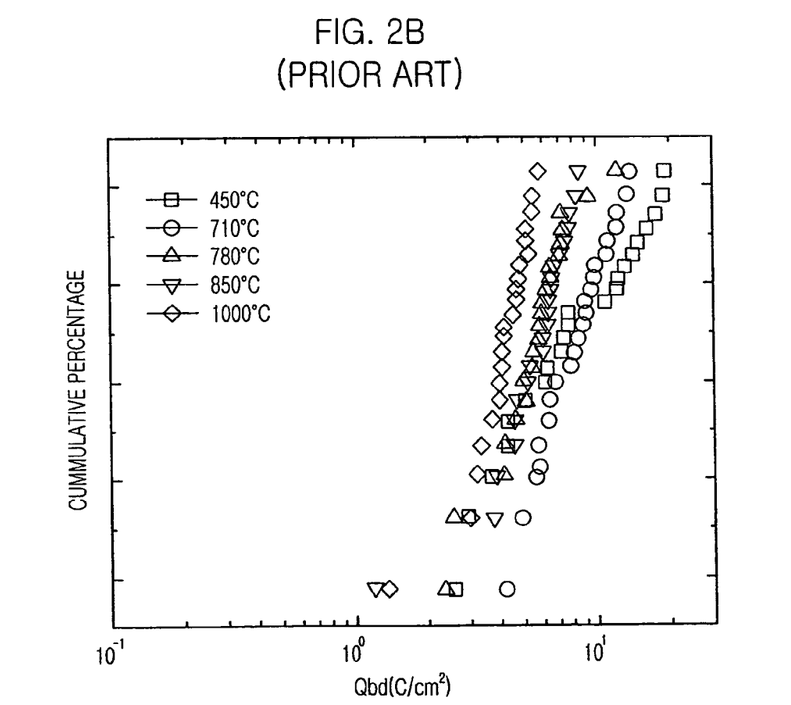
FIG. 2B is a graph showing changes in a charge-to-breakdown of a conventional gate dielectric layer depending on a temperature for an annealing process.
Figure 2C:
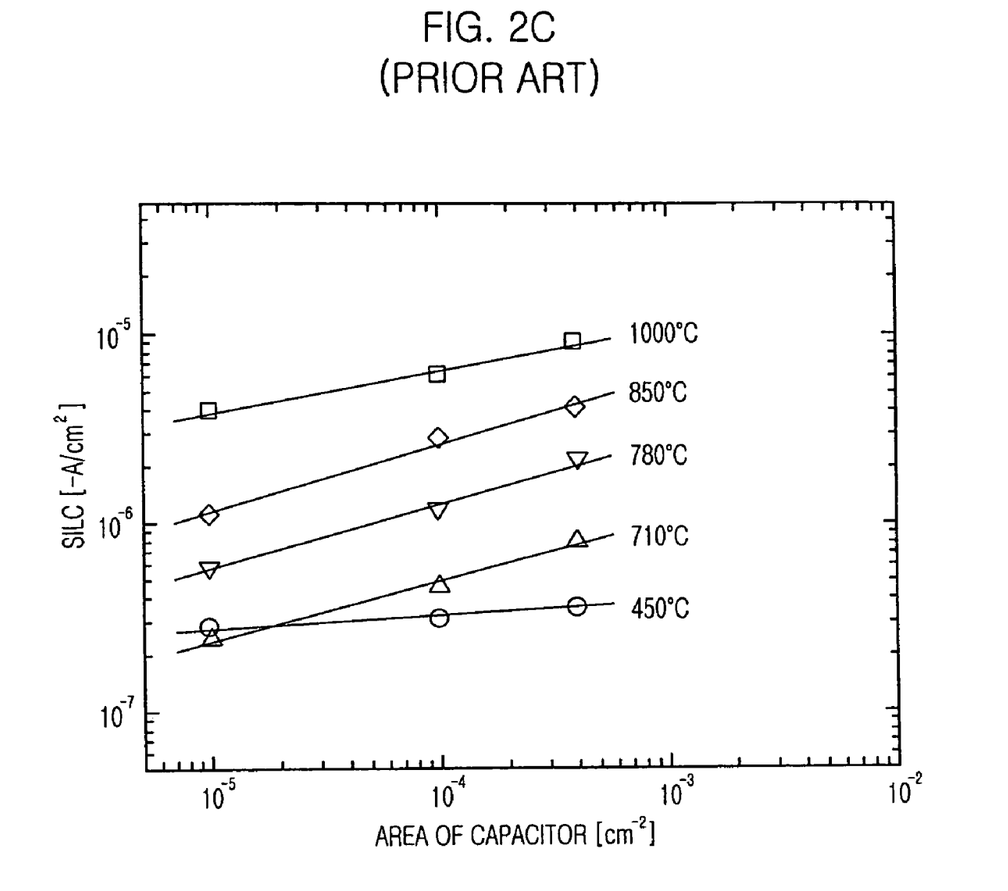
FIG. 2C shows a plot of a stress-induced-leakage-current (SILC) versus a capacitor area.

FIGS. 2B and 2C are graphs illustrating an effect of the thermal stress on reliability of a conventional gate dielectric layer.

Especially, FIG. 2B is a graph showing changes in a charge-to-breakdown characteristic of the conventional gate dielectric layer depending on a temperature for the annealing process. Herein, the denotation $Q_{bd}$ shown in FIG. 2B denotes an amount of charges in coulombs per unit area ($C/cm^2$).

FIG. 2C shows a plot of a stress-induced-leakage current (SILC) versus a capacitor area at different temperatures for the annealing process.

As shown in FIGS. 2B and 2C, as the temperature for the annealing process increases in an ascending order from 450° C., to 710° C., 780° C., 850° C. and 1000° C., the charge-to-breakdown characteristic and the SILC characteristic become greatly degraded. The reason for these results may be caused by an increase in the mechanical stress, i.e., the thermal stress, induced from the hard mask.

SUMMARY OF THE INVENTION

Consistent with the present invention, there is provided a method for fabricating a semiconductor device with a polymetal gate electrode capable of preventing a mechanical stress induced from a hard mask during a high thermal annealing process.

In accordance with an aspect of the present invention, there is provided a method for fabricating a semiconductor device, including the steps of: forming a gate structure including a gate dielectric layer, a polysilicon layer, a metal layer, an etch stop layer, and a sacrificial layer sequentially formed on a substrate; selectively performing a re-oxidation process to the gate structure; forming a spacer on each sidewall of the gate structure; implanting ions in the substrate for forming source/drain regions; selectively removing the sacrificial layer of the gate structure to form a recess; and filling an insulating hard mask into the recess for use in a self-aligned contact etching process into the recess.

BRIEF DESCRIPTION OF THE DRAWINGS

The above and other features and advantages of the present invention will become better understood with respect to the following description of the preferred embodiments given in conjunction with the accompanying drawings, in which.

DETAILED DESCRIPTION OF THE INVENTION

Hereinafter, a method for fabricating a semiconductor device with use of a partial gate recessing process in accordance with an embodiment of the present invention will be described in detail with reference to the accompanying drawings.

FIGS. 3A to 3G are cross-sectional views illustrating a method for fabricating a semiconductor device in accordance with an embodiment of the present invention.

Figure 3A:
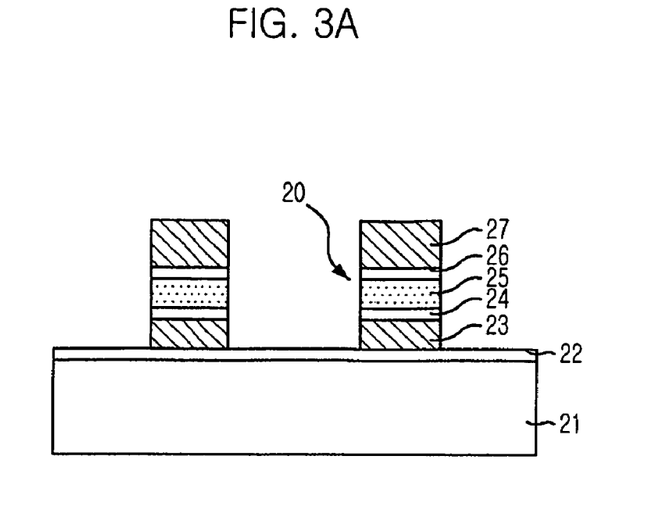
FIGS. 3A to 3G are cross-sectional views illustrating a method for fabricating a semiconductor device in accordance with a preferred embodiment of the present invention.

Referring to FIG. 3A, a gate dielectric layer 22 is formed on a substrate 21. Although not illustrated, the substrate 21 is provided with a device isolation region and a well by performing an ion implantation process. Then, a polysilicon layer 23, a diffusion barrier layer 24, a tungsten layer 25, an etch stop layer 26, and a sacrificial layer 27 are sequentially formed on the gate dielectric layer 22.

At this time, the polysilicon layer 23 is doped with one of N-type dopants and P-type dopants and has a thickness ranging from approximately 200 Å to approximately 800 Å. The diffusion barrier layer 24 is made of a metal-nitride based material such as tungsten nitride and has a thickness ranging from approximately 10 Å to approximately 100 Å. The tungsten layer 25 has a thickness ranging from approximately 300 Å to approximately 1000 Å. Also, the etch stop layer 26 is made of a material that is etched at a lower speed by a wet etching or a dry etching than is the sacrificial layer 27 in a subsequent step of removing the sacrificial layer 27. Examples of such material are silicon dioxide ($SiO_2$), silicon nitride ($Si_3N_4$) and silicon oxynitride (SiON). Also, the etch stop layer 26 has a thickness ranging from approximately 10 Å to approximately 100 Å. The sacrificial layer 27 is made of polysilicon. The sacrificial layer 27 has a thickness ranging from approximately 500 Å to approximately 5000 Å.

Next, a mask for forming a gate electrode is formed on the sacrificial layer 27. With use of the mask as an etch mask, the sacrificial layer 27, the etch stop layer 26, the tungsten layer 25, the diffusion barrier layer 24, and the polysilicon layer 23 are sequentially etched to form a plurality of gate structures 20.

Figure 3B:
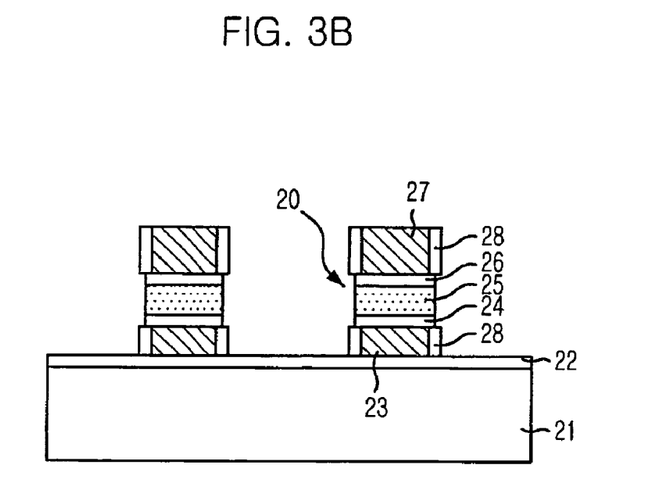

Referring to FIG. 3B, a gate re-oxidation process is performed. At this time, the gate re-oxidation process proceeds under a condition of a selective oxidation that does not oxidize the tungsten layer 25 but oxidizes the polysilicon layer 23, so that a silicon oxide layer 28 is formed on each sidewall of the polysilicon layer 23 and the sacrificial layer 27. Herein, the diffusion barrier layer 24 comprising at least tungsten and the etch stop layer 26 made of an insulating material are not oxidized during the gate re-oxidation process.

Figure 3C:
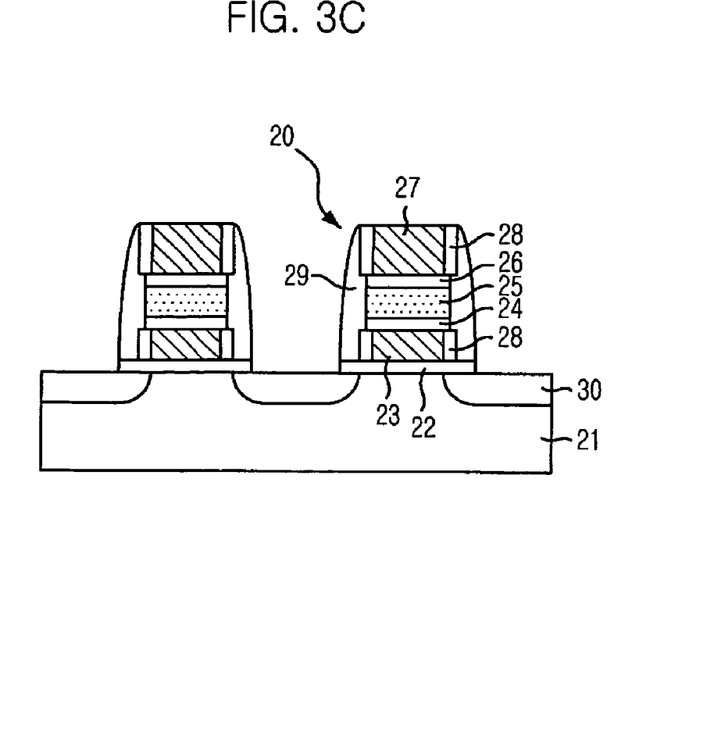

Referring to FIG. 3C, a spacer 29 is formed on each sidewall of the gate structure 20. The spacer 29 may comprise silicon nitride or a combination of silicon oxide and silicon nitride. In one aspect, the outer most surface of the spacer 29 comprises nitride to facilitate a subsequent self-aligned contact (SAC) etching process. After the formation of the spacer 29, an ion implantation process and a subsequent annealing process are performed to form source/drain regions 30.

The above gate structure with the sacrificial layer 27 is less affected by a mechanical stress created during a series of high thermal processes such as the gate re-oxidation process, the spacer formation process, the ion implantation process and the annealing process performed after the formation of the gate stack. Hence, it is possible to prevent degradation in reliability of the gate dielectric layer 22.

Figure 3D:
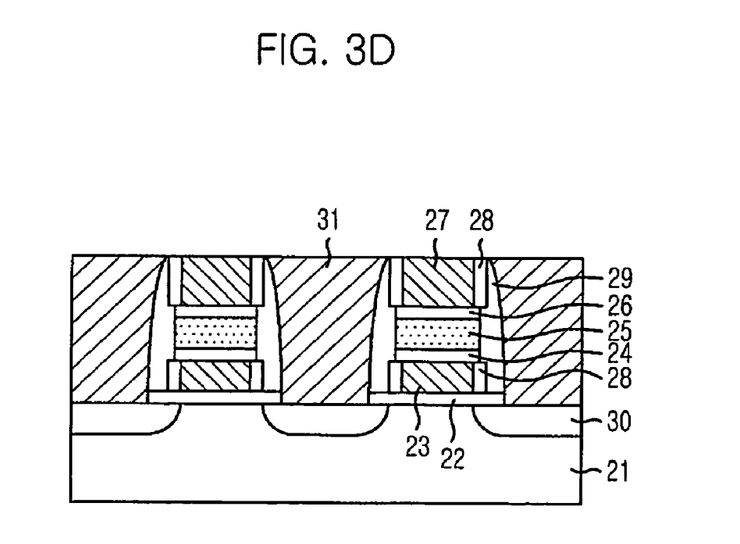

Referring to FIG. 3D, an inter-layer insulation layer 31 is formed on the above resulting structure. Then, the inter-layer insulation layer 31 is planarized by performing one of a chemical mechanical process (CMP) and an etch-back process to expose the sacrificial layer 27.

Figure 3E:
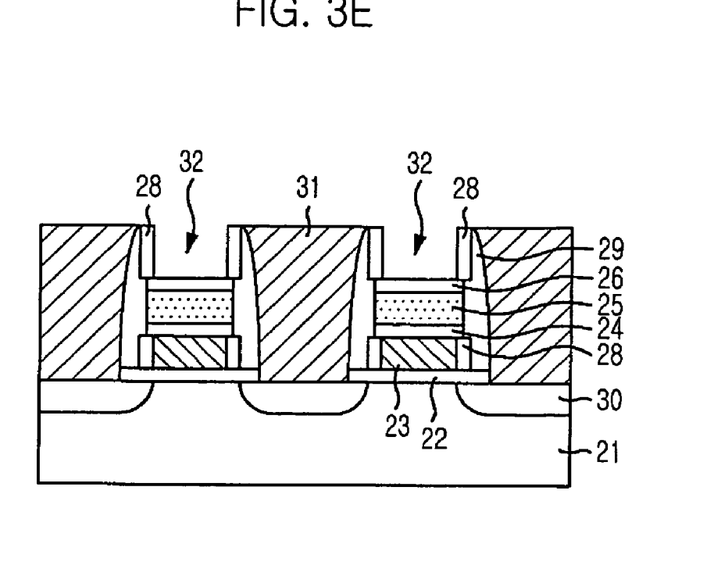

Referring to FIG. 3E, the sacrificial layer 27 is selectively removed, thereby obtaining a plurality of recesses 32. The selective removal of the sacrificial layer 27 proceeds by employing one of a wet etching process and a dry etching process. At this time, the etch stop layer 26 serves as a barrier layer during the selective etching of the sacrificial layer 27. Thus, a bottom part of the gate stack beneath the sacrificial layer 27 is not damaged by the above selected etching process. Also, during the removal of sacrificial layer 27, the silicon oxide layer 28 formed on the sidewalls of the sacrificial layer 27 has a lower etching rate than that of sacrificial layer 27 and is not substantially etched.

The above described series of processes is called a partial gate recessing process.

Figure 3F:
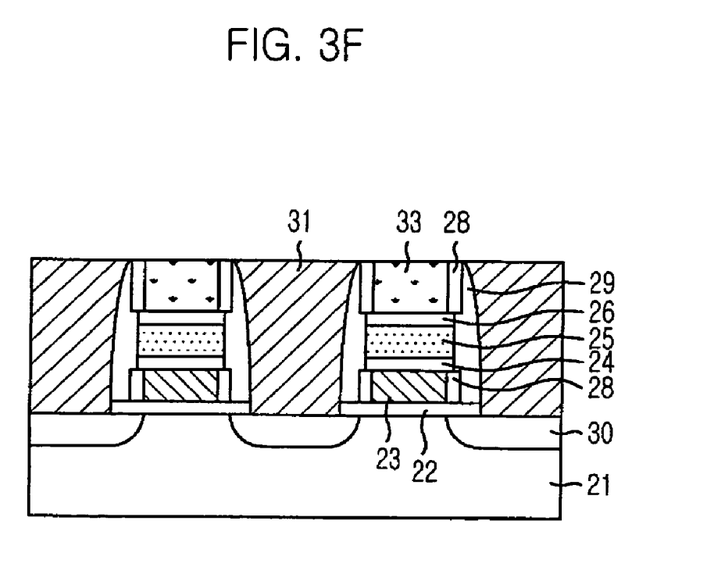

Referring to FIG. 3F, a layer for forming an insulating hard mask 33 for use in a subsequent SAC etching process is formed on the above resulting structure. Then, a CMP process or an etch-back process is performed, so that the recesses 32 are filled with the insulating hard mask 33.

In one aspect, the insulating hard mask 33 comprises the same material as the spacer 29 in order to achieve a reliable SAC etching process. For instance, the insulating hard mask 33 can be made of a dielectric material that has a lower etching rate than that of the inter-layer insulation layer 31 or nitride-based materials such as $Si_3N_4$ and SiON during the aforementioned SAC etching process.

Figure 3G:
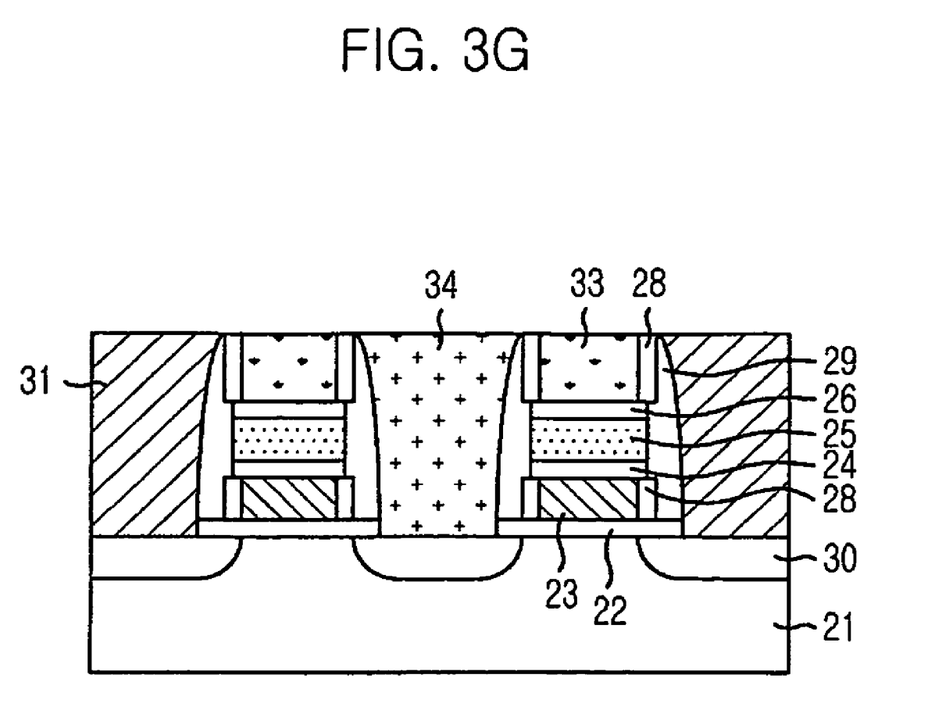

Referring to FIG. 3G, a portion of the inter-layer insulation layer is subjected to the aforementioned SAC etching process to form a contact hole exposing the corresponding source/drain region 30. Thereafter, a conducting material is filled into each of the contact holes to form contacts 34.

In accordance with the preferred embodiment of the present invention, there is an effect of preventing degradation in a dielectric characteristic of the gate dielectric layer during the high thermal processes by forming the gate stack with the polysilicon layer inducing less mechanical stress.

Since the insulating hard mask for the SAC etching process is formed after the ion implantation process and the annealing process for forming the source/drain regions, it is also possible to perform the SAC etching process more stably and improve reliability of resulting devices.

Although the described embodiment of the present invention exemplifies the polymetal gate electrode made of tungsten, it is possible to form a polymetal gate electrode made of other metals.

While the present invention has been described with respect to certain embodiments, it will be apparent to those skilled in the art that various changes and modifications may be made without departing from the spirit and scope of the invention as defined in the following claims.

What is claimed is:

1. A method for fabricating a semiconductor device, comprising the steps of:
    forming a gate structure including a gate dielectric layer, a polysilicon layer, a metal layer, an etch stop layer, and a sacrificial layer sequentially formed on a substrate, wherein the gate structure has two sidewalls;
    selectively performing a re-oxidation process to the gate structure to form a silicon oxide layer on the sidewalls of the polysilicon layer and the sacrificial layer;
    forming a spacer on each sidewall of the gate structure and on the silicon oxide layers;
    implanting ions in the substrate for forming source/drain regions;
    selectively removing the sacrificial layer of the gate structure to form a recess; and filling an insulating hard mask into the recess for use in a self-aligned contact etching process.

2. The method of claim 1, wherein the sacrificial layer is made of polysilicon.

3. The method of claim 2, wherein the sacrificial layer has a thickness ranging from approximately 500 Å to approximately 5000 Å.

4. The method of claim 1, wherein the step of selectively removing the sacrificial layer proceeds by performing a wet etching process.

5. The method of claim 1, wherein the step of selectively removing the sacrificial layer proceeds by performing a dry etching process.

6. The method of claim 1, wherein the etch stop layer is made of an insulating material that is etched at a lower speed than is the sacrificial layer when removing the sacrificial layer.

7. The method of claim 6, wherein the insulating material is made of a material selected from a group consisting of silicon oxide, nitride, and oxynitride.

8. The method of claim 1, wherein the insulating hard mask is made of a material selected from a group consisting of silicon nitride and oxynitride.

* * * * *